US008634006B2

(12) United States Patent
Yahav et al.

(10) Patent No.: US 8,634,006 B2
(45) Date of Patent: Jan. 21, 2014

(54) IMAGE SENSOR AND A CONFIGURATION FOR IMPROVED SKEW TIME

(75) Inventors: Giora Yahav, Haifa (IL); Dan Admon, Tivon (IL)

(73) Assignee: Microsoft International Holdings B.V., Amsterdam (NL)

( * ) Notice: Subject to any disclaimer, the term of this patent is extended or adjusted under 35 U.S.C. 154(b) by 365 days.

(21) Appl. No.: 12/865,622

(22) PCT Filed: Dec. 19, 2007

(86) PCT No.: PCT/IL2007/001572
§ 371 (c)(1),
(2), (4) Date: Oct. 25, 2010

(87) PCT Pub. No.: WO2009/078003
PCT Pub. Date: Jun. 25, 2009

(65) Prior Publication Data
US 2011/0043673 A1     Feb. 24, 2011

(51) Int. Cl.
*H04N 3/14*     (2006.01)
*H04N 5/335*     (2011.01)

(52) U.S. Cl.
USPC .......................................................... 348/294

(58) Field of Classification Search
USPC ............... 348/222.1, 241, 294, 302, 311, 312
See application file for complete search history.

(56) References Cited

U.S. PATENT DOCUMENTS

| | | | | |
|---|---|---|---|---|
| 5,557,779 A * | 9/1996 | Minami | ........................ | 716/114 |
| 5,656,963 A * | 8/1997 | Masleid et al. | ................ | 327/297 |
| 6,204,713 B1 * | 3/2001 | Adams et al. | .................. | 327/295 |
| 6,205,571 B1 * | 3/2001 | Camporese et al. | .......... | 716/114 |
| 6,311,313 B1 * | 10/2001 | Camporese et al. | .......... | 716/113 |
| 6,651,224 B1 * | 11/2003 | Sano et al. | ...................... | 716/114 |
| 6,696,863 B2 * | 2/2004 | Yamamoto et al. | .............. | 326/93 |
| 7,032,198 B2 * | 4/2006 | Sano et al. | ...................... | 716/104 |
| 7,475,374 B1 * | 1/2009 | Johnson et al. | ................ | 716/119 |
| 7,661,086 B1 * | 2/2010 | Pitkethly et al. | ............... | 716/113 |
| 7,730,440 B2 * | 6/2010 | Pitkethly | ........................ | 716/126 |
| 8,310,574 B2 * | 11/2012 | Okano et al. | .................... | 348/294 |
| 2003/0052724 A1 * | 3/2003 | Yamamoto et al. | ............ | 327/295 |
| 2004/0107408 A1 * | 6/2004 | Sano et al. | ......................... | 716/2 |
| 2006/0001918 A1 * | 1/2006 | Okano et al. | .................... | 358/482 |
| 2007/0025493 A1 * | 2/2007 | Pitkethly | ........................ | 375/377 |
| 2009/0128675 A1 * | 5/2009 | Okano et al. | .................... | 348/294 |

FOREIGN PATENT DOCUMENTS

WO         99/40478        8/1999

OTHER PUBLICATIONS

European Communication dated Aug. 17, 2010, EP Application No. 07849598.3 filed Dec. 19, 2007.
Amendment dated Aug. 30, 2010, EP Application No. 07849598.3 filed Dec. 19, 2007.
International Preliminary Report on Patentability and Written Opinion dated Jun. 22, 2010, International Appln. No. PCT/IL2007/001572 filed Dec. 19, 2007.

(Continued)

*Primary Examiner* — Nicholas Giles
(74) *Attorney, Agent, or Firm* — Vierra Magen Marcus LLP

(57) ABSTRACT

A method of providing a signal to a plurality of signal destinations configured in a planar array, the method comprising: electrically connecting all the signal destinations with at least one conducting element; and providing the signal substantially simultaneously to signal destinations substantially along the perimeter of the planar array and along diagonals of a rectangle.

29 Claims, 6 Drawing Sheets

(56) References Cited

OTHER PUBLICATIONS

Toyama, Kentaro, et al., "Probabilistic Tracking in a Metric Space," Eighth International Conference on Computer Vision, Vancouver, Canada, vol. 2, Jul. 2001, 8 pages.

Chinese Office Action dated Mar. 26, 2013, Chinese Patent Application No. 20078012337.1.

Response to Office Action dated Aug. 12, 2013, Chinese Patent Application No. 200780102337.1.

English translation of the Amended Claims filed in Response to Office Action dated Aug. 12, 2013, Chinese Patent Application No. 200780102337.1.

* cited by examiner

IMAGE SENSOR AND A CONFIGURATION FOR IMPROVED SKEW TIME

FIELD

The invention relates to skew time in electronic circuits.

BACKGROUND

Skew time, also referred to hereinafter as "skew", is a term typically used in electronics and physics to describe a maximum difference between a time in which a signal simultaneously sent from a same source to two or more different destinations first arrives at a destination and last arrives at a destination. Electronic circuits are typically affected by two types of skew times, clock skew and non-clock skew. Clock skew occurs in synchronous circuits and is usually associated with a clock signal from a common clock source arriving at different components at different times. Non-clock skew occurs in synchronous and/or asynchronous circuits and is generally associated with a common signal from a common signal source, other than the clock signal in synchronous circuits, propagating through a circuit and arriving at different components at different times.

A cause of skew is generally attributed to the use of different wire-interconnect lengths between the signal source and different destination components. Several methods are known in the art which attempt to deal with this problem. An example of such method is described in U.S. Pat. No. 5,784,600; "Method of Generating Exact-Length Wires for Routing Critical Signal", which is incorporated herein by reference. The method describes "an automated method for adjusting wire lengths between connected circuit elements of an integrated circuit which includes the following steps: (1) receiving a value specifying a wire length that must be provided between terminals of two integrated circuits in the integrated circuit design; (2) defining a routing region in which the wire can be routed; and (3) automatically specifying a wire route including a serpentine section with the routing region for connecting the terminals. The serpentine section will include one or more legs sized to ensure that the wire route has the specified wire length. Specifically disclosed is the application of the method to size wiring between two clock buffers in separate and adjacent stages of a clock distribution network."

Other causes of skew are typically attributed to interconnect capacitive coupling, use of buffers having unequal delays, and/or use of different number of clock buffers between the clock source and clock loads. An example of a method which attempts to remedy these causes is described in U.S. Pat. No. 6,256,766; "Method and apparatus for reducing clock skew", incorporated herein by reference. Described therein is "a method for reducing skew in a common signal as applied to individual elements in the design phase. In accordance with the principles of the invention, the design of the wiring is established and augmented with compensation elements and/or delay elements as necessary to equalize the skew between relevant components. In the disclosed embodiment, the method generally comprises steps: (1) grouping loads on the common signal; (2) creating a signal wiring tree and inserting delay cells; and (3) providing necessary loading compensation. The loads are grouped such that each utilized node on a central wiring experiences substantially equal loading, with compensating loads added as necessary. The nodes are established at intervals corresponding to the availability of delay elements, which are added to the branches feeding the farthest elements as necessary to equate the time delay of each node with respect to the source of the common signal."

3D imaging systems generally comprise electro-optical systems adapted to capture and generate three dimensional (3D) images of an object or scene. Their application may be found in many aspects of daily life such as medical imaging systems, TV and movie studio production systems, face recognition systems, surveying systems, robotic guidance systems, and automotive guidance and control systems. CCD (charge coupled device) and CMOS (complementary metal oxide semiconductor) technologies are typically used in image sensors comprised in the 3D imaging systems.

CCD, compared with CMOS, offers advantages of extremely low noise, low dark currents (from thermally generated charge carriers), a high ratio of collected electrons to incident photons, and a high ratio of light sensitive area to pixel size. CMOS technology allows for many circuit functions to be placed on a single IC together with the pixels. Some of these circuit function comprise, for example, timing generation, signal processing, analog-to-digital conversion and interface. CMOS pixels generally comprise photodiodes although other photo-sensing elements may be used. Another advantage over CCD is the lower voltage and low power requirements of CMOS.

3D imaging systems may be classified into three groups according to the technique used to capture the 3D image of the object or scene: triangulation systems, interferometry systems, and time-of-flight (TOF) systems. A description of a triangulation imaging system may be found in U.S. Pat. No. 6,756,606: "Three Dimensional Imaging by Dual Wavelength Triangulation", and of an interferometry imaging system may be found in U.S. Pat. No. 5,926,277: "Method and Apparatus for Three Dimensional Imaging Using Laser Illumination Interferometry", both of which are incorporated herein by reference. Triangulation systems and interferometry systems are generally more complex and costlier than TOF systems, making their use in day to day applications more restricted compared to TOF systems.

TOF systems are typically divided into two classes, modulation type and pulse type. Both classes use a laser source, typically located in a camera, which is directed at the object whose image is to be acquired in 3D. The laser source produces a light, or laser beam, which impinges on the object, a portion of which is reflected back to the image sensor located in the camera. In modulation type systems, a phase of the reflected portion is compared to a phase of the transmitted beam to generate a 3D image. Scanning is typically done one line at a time. Pulse type systems generally use a "scannerless" method, which comprises generating a short laser pulse having a relatively large field of illumination. The laser pulse may be thought of as a wall of light, which hits the object in the field of view (FOV), a portion of which is reflected back towards the sensor. Pulse type systems are generally preferred over the modulation system as image capture is faster and the use of a mechanical device to perform the scanning is not required.

Pulse type systems require substantially fast discrimination capability and/or relatively high detection speed. Fast discrimination capability requires the use of non-CMOS technologies in the sensor, which makes the sensor rather costly and generally unsuitable for wide commercial applications. High detection speed requires fast gating of the reflected portion entering the camera. This requires that the pixels comprised in the image sensor be substantially simultaneously triggered. This may be achieved using CMOS technology by substantially eliminating the skew time between the pixels.

More information on 3D imaging systems may be found in "A CMOS 3D Camera with Millimetric Depth Resolution", Cristiano Niclass, Alexis Rochas, Pierre-Andre Besse, and Edoardo Charbon, Swiss Federal Institute of Technology, Lausanne, Switzerland (http://aqua.epfl.ch/PDF/CICC04.pdf); "8.2: A CMOS Smart Pixel for Active 3D Vision Applications", Luigi Viarani, David Stoppa, Lorenzo Gonzo, Massimo Gottardi and Andrea Simoni, Integrated Optical Sensors Group, ITC-IRST, (vvww.itc.it/soipublications/pub/46.pdf); and "3D Imaging in the Studio (and Elsewhere . . . )", G. J. Iddan and G. Yahav, 3DV Systems Ltd, Yokneam, Israel, (www.3dvsystems.com); all of which are incorporated herein by reference. Comparative analyses of the advantages in using CCD and/or CMOS may be found in "CCD versus CMOS—has CCD imaging come to an end?", Nicolas Blanc, Zurich (www.ipf.uni-stuttgart.de/publications/phowo01Blanc.pdf); and "CCD vs. CMOS: Facts and Fiction", January 2001 issue, Photonics Spectra, Lauren Publishing Co. Inc., (www.dalsa.com/shared/content/Photonics_CCDvsCMOS_Litwiller.pdf); both of which are incorporated herein by reference.

SUMMARY

An aspect of some embodiments of the invention relates to providing a configuration for distributing an electrical signal throughout an array of elements in an electronic circuit, wherein the signal is received by all elements comprised in the array substantially at a same time.

An aspect of some embodiments of the invention relates to configuring a plurality of circuit drivers relative to the array, and to connecting the circuit drivers to the elements in the array, such that the propagation delay of the signal to all elements is substantially the same. This results in a skew time, measured as a maximum difference between a time at which the signal simultaneously sent first arrives at an element in the array and last arrives at an element in the array that is relatively small.

In accordance with an embodiment of the invention, each circuit driver comprises a serially connected pre-driver and front-end driver, adapted to drive the signal from a signal source to at least one element in the array. Interconnects connecting the pre-drivers to the front-end drivers have substantially a same physical length. Using serially connected pre-drivers and front-end drivers with equal length interconnects provides for a relatively small, substantially similar, signal propagation delay through all the circuit drivers. Some of the front-end drivers are positioned peripherally, around the array, and some are positioned substantially along diagonals of the array. The pre-drivers are aligned along two opposite sides of the array.

In accordance with an embodiment of the invention, the method is applied to a photo-surface comprising an array of pixels. The array of pixels is rectangular shaped, although it may optionally be square, round or any other geometrical shape. The photo-surface, optionally, a CMOS image sensor, is adapted to receive a gating signal and distribute the signal to pixels in the array such that skew time is relatively small. Hence, the gating signal is able to trigger the operation of all the pixels at substantially a same time. Substantially simultaneous operation of all pixels results in an improved acquisition of a 3D image of an object.

The inventors developed a test bench model that simulates the pixel array and application of the gating signal to the pixels. The gating signals were simulated several times using different interconnect widths and for different process corners. The process corners considered were TT, FF, FS, SS, and SF. Process corners are generally used in IC design as a measure of the effect of manufacturing process variations and environmental variations on the speed of transistors comprised in ICs. A design goal in ICs is reliable operation within limits established by the process corners.

The test bench simulations exhibited skew times that varied from approximately 61 psec-72 psec for an interconnect width of 1 μm, to approximately 28 psec-35 psec for an interconnect width of 2.5 μm. Rise time varied from approximately 800 psec-880 psec for an interconnect width of 1 μm, to approximately 730 psec-825 psec for an interconnect width of 2.5 μm.

There is therefore provided in accordance with an embodiment of the invention, a method of providing a signal to a plurality of signal destinations configured in a planar array, the method comprising: electrically connecting all the signal destinations with at least one conducting element; providing the signal substantially simultaneously to signal destinations along the perimeter of the planar array and along diagonals of a rectangle.

Optionally, providing the signal along diagonals of a rectangle comprises providing the signal to signal destinations along both diagonals substantially of a same rectangle. Optionally, the rectangle is a substantially circumscribed rectangle. Optionally, the rectangle is a substantially inscribed rectangle.

In some embodiments of the invention, the at least one conducting element is substantially planar. Optionally, the at least one conducting element has a rectangular perimeter having first and second sides parallel to an x-axis and third and fourth sides parallel to an orthogonal y-axis. Additionally or alternatively, the at least one conductor comprises a continuous planar conducting sheet parallel to the plane of the array of signal destinations.

In some embodiments of the invention, the at least one conductor comprises a planar xy-grid of equally spaced linear conductors parallel to the planar array of signal destinations.

In some embodiments of the invention, the at least one conductor comprises a planar xy-grid of equally spaced linear conductors parallel to the planar array of signal destinations. Optionally, the xy-grid has a rectangular perimeter having first and second sides parallel to an x-axis of the grid and third and fourth sides parallel to a y-axis of the grid. Additionally or alternatively, the sides of the perimeter are parallel to the rectangle that circumscribes the planar array of signal destinations. Optionally, providing the signal to signal destinations along the perimeter comprises providing the signal to the at least one conducting element at contact regions along each of the sides of the rectangular perimeter of the conducting element. Optionally, the contact regions are substantially equally spaced around the perimeter.

In some embodiments of the invention, providing the signal to signal destinations along the diagonals of the circumscribed rectangle comprises providing the signal to the at least one conducting element at contact regions along the diagonals of the rectangular perimeter of the at least one conducting element. Optionally, the contact regions are substantially equally spaced along the diagonals.

In some embodiments of the invention, providing the signal to a contact region comprises connecting an output of a first signal driver to the contact region and controlling the first signal driver to provide the signal at the output. Optionally, controlling the first signal driver comprises connecting each of first signal drivers to a different second signal driver with a substantially same length signal path and controlling the second signal drivers to simultaneously transmit the signal to their respective first signal divers. Optionally, the second signal drivers are located along the third and fourth sides of the rectangular perimeter of the at least one conducting element.

Optionally, electrically connecting comprises electrically each first driver along the third and fourth sides of the perimeter of the at least one conducting element to a second driver respectively along the fourth and third side of the perimeter.

Optionally, connecting a first driver along the third or fourth side to a second driver along the fourth or third side respectively comprises connecting them with a rectilinear conductor substantially parallel to the x-axis.

In some embodiments of the invention, electrically connecting comprises electrically connecting each first driver along the first and second sides of the perimeter of the at least one conducting element to a second driver along the third and fourth side respectively. Optionally, electrically connecting each first driver along the first and second sides of the perimeter to a second driver comprises connecting each first driver to a different second driver. Optionally, electrically connecting each first driver along the first and second side to a different second driver along the third and fourth side respectively comprises connecting them with rectilinear conductors substantially parallel to the planar array of signal destinations. Optionally, electrically connecting first drivers along the first and second sides to second drivers along the third and fourth side respectively comprises connecting each first driver to a second driver with a rectilinear conductor parallel to the y-axis that extends from a region near the first driver that meets a second rectilinear conductor parallel to the x-axis that extends from a region near the second driver. Optionally, meeting regions of the conductors parallel to the x-axis and y-axis that connect first drivers along the first side to second drivers along the third side lie substantially along a same straight line characterized by a slope having absolute value 1 relative to the x and y-axes. Additionally or alternatively, meeting regions of the conductors parallel to the x-axis and y-axis that connect first drivers along the second side to second drivers along the fourth side lie substantially along a same straight line characterized by a slope having absolute value 1 relative to the x and y-axes.

In some embodiments of the invention, the planar array of signal destinations comprises a rectangular array of rows and columns of signal destinations. Optionally, the signal destinations are pixels in a photosurface.

There is further provided in accordance with an embodiment of the invention, apparatus comprising a plurality of signal destinations configured in a planar array, the apparatus comprising: at least one conducting element that electrically connects all the signal destinations; at least one signal source that provides a signal substantially simultaneously to signal destinations along the perimeter of the planar array and along diagonals of a rectangle.

Optionally, the diagonals are diagonals substantially of a same rectangle. Optionally, the rectangle is a substantially circumscribed rectangle. Optionally, the rectangle is a substantially inscribed rectangle.

In some embodiments of the invention, the at least one conducting element is substantially planar. Optionally, the at least one conducting element has a rectangular perimeter having first and second sides parallel to an x-axis and third and fourth sides parallel to an orthogonal y-axis. Additionally or alternatively, the at least one conductor comprises a continuous planar conducting sheet parallel to the plane of the array of signal destinations. Optionally, the at least one conductor comprises a planar xy-grid of equally spaced linear conductors parallel to the planar array of signal destinations.

In some embodiments of the invention, the at least one conductor comprises a planar xy-grid of equally spaced linear conductors parallel to the planar array of signal destinations. Optionally, the xy-grid has a rectangular perimeter having first and second sides parallel to an x-axis of the grid and third and fourth sides parallel to a y-axis of the grid. Additionally or alternatively, the sides of the perimeter are parallel to the rectangle that circumscribes the planar array of signal destinations. Optionally, the at least one signal source provides the signal to the at least one conducting element at contact regions along each of the sides of the rectangular perimeter of the conducting element. Optionally, the contact regions are substantially equally spaced around the perimeter.

In some embodiments of the invention, the at least one signal source provides the signal to the at least one conducting element at contact regions along the diagonals of the rectangular perimeter of the at least one conducting element. Optionally, the contact regions are substantially equally spaced along the diagonals.

In some embodiments of the invention, the at least one signal source comprises a first signal driver for each contact region having an output that is electrically connected to the contact region. Optionally, the at least one signal sources comprises a different second signal driver connected to each first signal driver with a substantially same length signal path. Optionally, the second signal drivers are located along the third and fourth sides of the rectangular perimeter of the at least one conducting element. Optionally, each first driver along the third and fourth sides of the perimeter of the at least one conducting element is electrically connected to a second driver respectively along the fourth and third side of the perimeter. Optionally, a first driver along the third or fourth side is electrically connected to a second driver along the fourth or third side respectively with a rectilinear conductor substantially parallel to the x-axis. Optionally, each first driver along the first and second sides of the perimeter of the at least one conducting element is electrically connected to a second driver along the third and fourth side respectively. Optionally, each first driver along the first and second sides of the perimeter is electrically connected to a different second driver. Optionally, each first driver along the first and second side is connected to second driver along the third and fourth side respectively with rectilinear conductors substantially parallel to the planar array of signal destinations. Optionally, each first drivers along the first and second sides is electrically connected to a second driver along the third and fourth side respectively by a rectilinear conductor parallel to the y-axis that extends from a region near the first driver that meets a second rectilinear conductor parallel to the x-axis that extends from a region near the second driver. Optionally, meeting regions of the conductors parallel to the x-axis and y-axis that connect first drivers along the first side to second drivers along the third side lie substantially along a same straight line characterized by a slope having absolute value 1 relative to the x and y-axes. Additionally or alternatively, meeting regions of the conductors parallel to the x-axis and y-axis that connect first drivers along the second side to second drivers along the fourth side lie substantially along a same straight line characterized by a slope having absolute value 1 relative to the x and y-axes.

In some embodiments of the invention, the planar array of signal destinations comprises a rectangular array of rows and columns of signal destinations. Optionally, the signal destinations are pixels in a photosurface.

BRIEF DESCRIPTION OF FIGURES

Examples illustrative of embodiments of the invention are described below with reference to figures attached hereto. In the figures, identical structures, elements or parts that appear in more than one figure are generally labeled with a same numeral in all the figures in which they appear. Dimensions of components and features shown in the figures are generally chosen for convenience and clarity of presentation and are not necessarily shown to scale. The figures are listed below.

DETAILED DESCRIPTION

Figure 1:
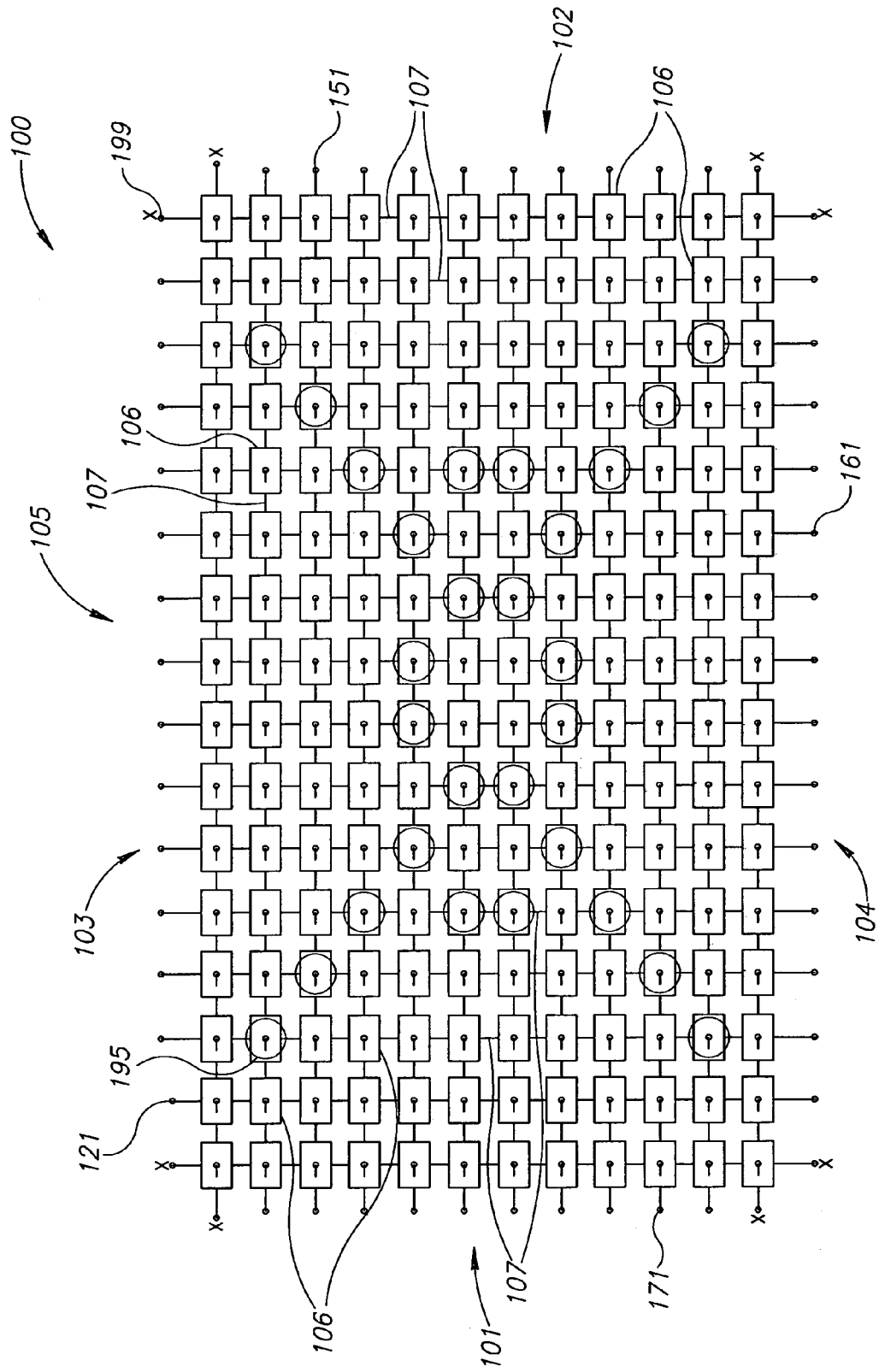
FIG. 1 schematically illustrates the locations of pre-drivers and front-end drivers in an exemplary image sensor, comprising an array of pixels, in accordance with an embodiment of the invention.

Reference is made to FIG. 1, which schematically shows an exemplary array 105 of elements 106, comprised in a device 100, in a configuration wherein an applied signal may be received by all elements in the array substantially at the same time, in accordance with an embodiment of the invention.

Array 105 is shown as a rectangular array comprising 16×12 elements, although array 105 may optionally be circular, or of some other geometrical shape suitable for comprising an array of elements. The use of the word rectangle or rectangular is used to include square right angle quadrilaterals as well as right angle quadrilaterals for which two sides are not equal. Array 105 represents an array of 320×240 elements (76800 elements), although array 105 may optionally comprise more or less elements, and may represent an array with greater than or lesser than 76800 elements.

Elements 106 are connected to one another through a matrix of interconnects 107. Elements 106 are driven by circuit drivers (not shown), each circuit driver comprising a serially connected pre-driver and a front-end driver. In accordance with an embodiment of the invention, the circuit drivers are positioned with respect to array 105 such that the interconnect length between the pre-drivers and the front-end drivers is substantially the same. Hence, signal propagation delay in all the circuit drivers is substantially the same, and as a result, skew time between the elements is substantially reduced.

The front-end drivers are peripherally connected to connection points on the interconnect matrix along edges 101, 102, 103, and 104 of array 105; for example connection points 171 on edge 101, connections point 151 on edge 102, connection points 121 on edge 103, and connections point 161 on edge 104. Front-end drivers, optionally positioned inside array 105, are connected to connection points on the interconnect matrix located substantially along diagonals of the array. The connection points are shown by circles, for example circle 195. Connection points 199, marked by an "X", at the four corners of array 105 are left disconnected.

For rectangular arrays having sides between about 0.5 cm and about 1 cm, the inventors have determined that a number of front end drivers per side or per diagonal is advantageously equal to between about 18 and about 30. Optionally the number of front end drivers per is between about 20 and about 27.

Figure 2:
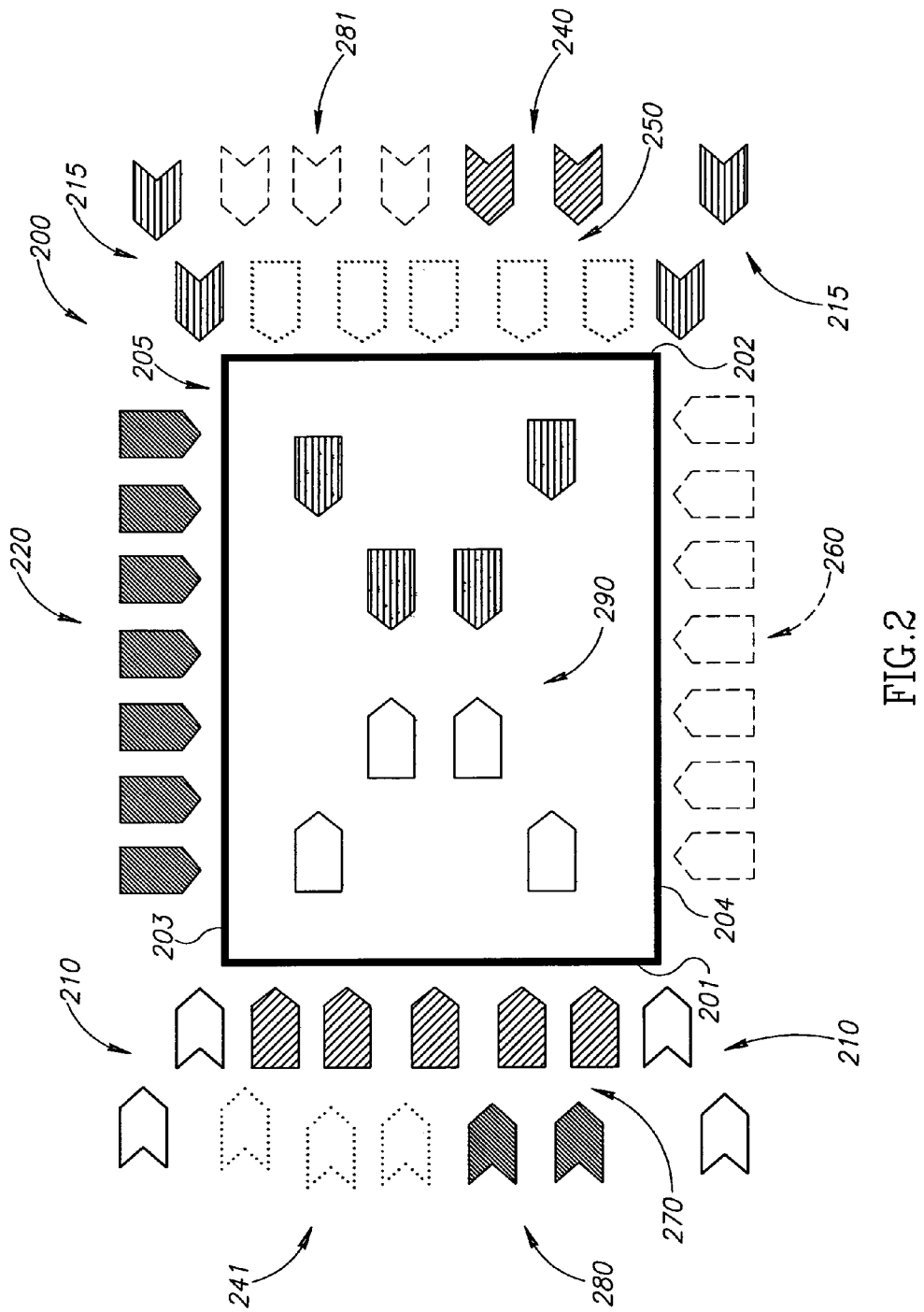
FIG. 2 schematically illustrates a photo-surface comprised in the exemplary image sensor of FIG. 1, in accordance with an embodiment of the invention; and, FIG. 4 schematically illustrates a 3D graphical representation of the distribution of the skew throughout the pixel array for a simulated gating signal interconnect width of 2 μm and typical process corners TT, in accordance with an embodiment of the invention.

Reference is made to FIG. 2, which schematically shows an exemplary image sensor 200 comprising a photo-surface 205, in accordance with an embodiment of the invention. Photo-surface 205 optionally includes an array of 320×240 pixels, the array the same or substantially similar to array 105 shown in FIG. 1. Optionally, photo-surface 205 may comprise more or less than 76800 pixels, and may optionally be of any geometrical shape. In accordance with an embodiment of the invention, photo-surface 205 is adapted to receive a gating signal from a gating signal source and distribute the signal throughout the pixel array such that skew time is relatively small. Hence, the gating signal triggers the operation of all the pixels at substantially a same time. Substantially simultaneous operation of all pixels results in an improved, uniform acquisition of a 3D image of an object by image sensor 200.

The pixels in photo-surface 205 are connected to circuit drivers, each circuit driver comprising a serially connected pre-driver, shown in the drawing as pentagon shaped with a fin-like tail, and front-end driver, shown in the drawing as pentagon shaped. The circuit drivers are adapted to transmit a gating signal from a signal source (not shown) to each pixel on photo-surface 205. The gating signal is delivered simultaneously to the pre-drivers using a binary clock tree. The pre-drivers and the front-end drivers are optionally three stage inverter drivers, a first stage having a relatively low input capacitance. Pre-drivers 210 (shown with a solid line perimeter), 241 (shown with a dotted line perimeter), and 280 (shown with solid shading) are located along an edge 201 of photo-surface 205, while oppositely located along an edge 202 of photo-surface 205 are pre-drivers 215 (shown with solid line shading), 240 (shown with diagonal shading), and 281 (shown with a hatched line perimeter). Peripherally located around photo-surface 205 are the front-end drivers; front-end drivers 270 (shown with diagonal shading) along edge 201, front-end drivers 220 (shown with solid shading) along edge 203, front-end drivers 250 (shown with dotted line perimeter) along edge 202, and front-end drivers 260 (shown with hatched line perimeter) along edge 204. Internally located within photo-surface 205, substantially along the diagonals of the array, are front-end drivers 290 (shown with solid line perimeter and with solid line shading).

Image sensor 200 is optionally fabricated using CMOS technology, although in some embodiments of the invention, image sensor 200 may be fabricated using other technologies suitable for image sensors, such as for example, CCD technology.

Figure 3A:
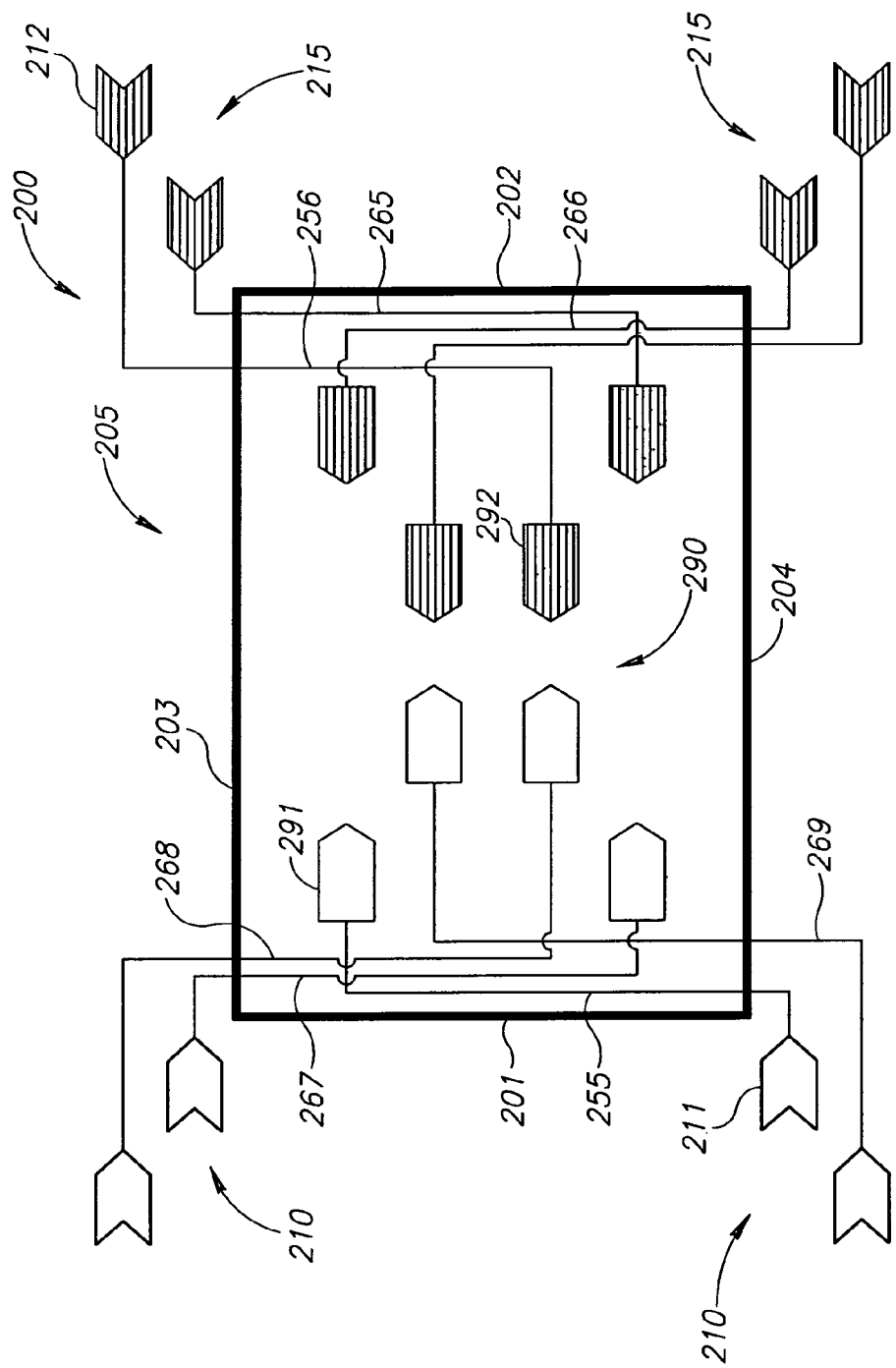
FIGS. 3a, 3b and 3c schematically illustrate the interconnections of the pre-drivers and front-end drivers in the exemplary image sensor of FIG. 1, in accordance with an embodiment of the invention.
Figure 3B:
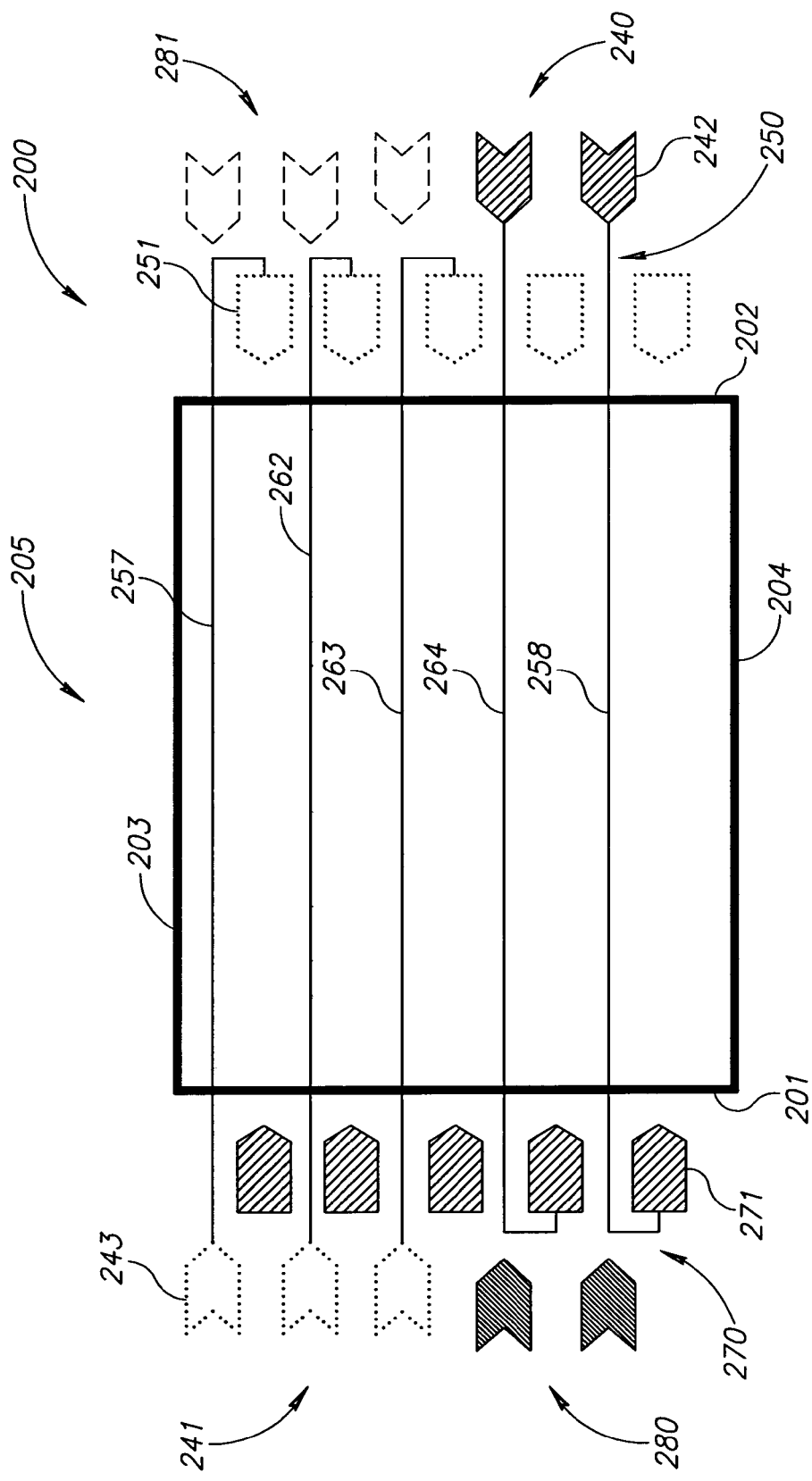
Figure 3C:
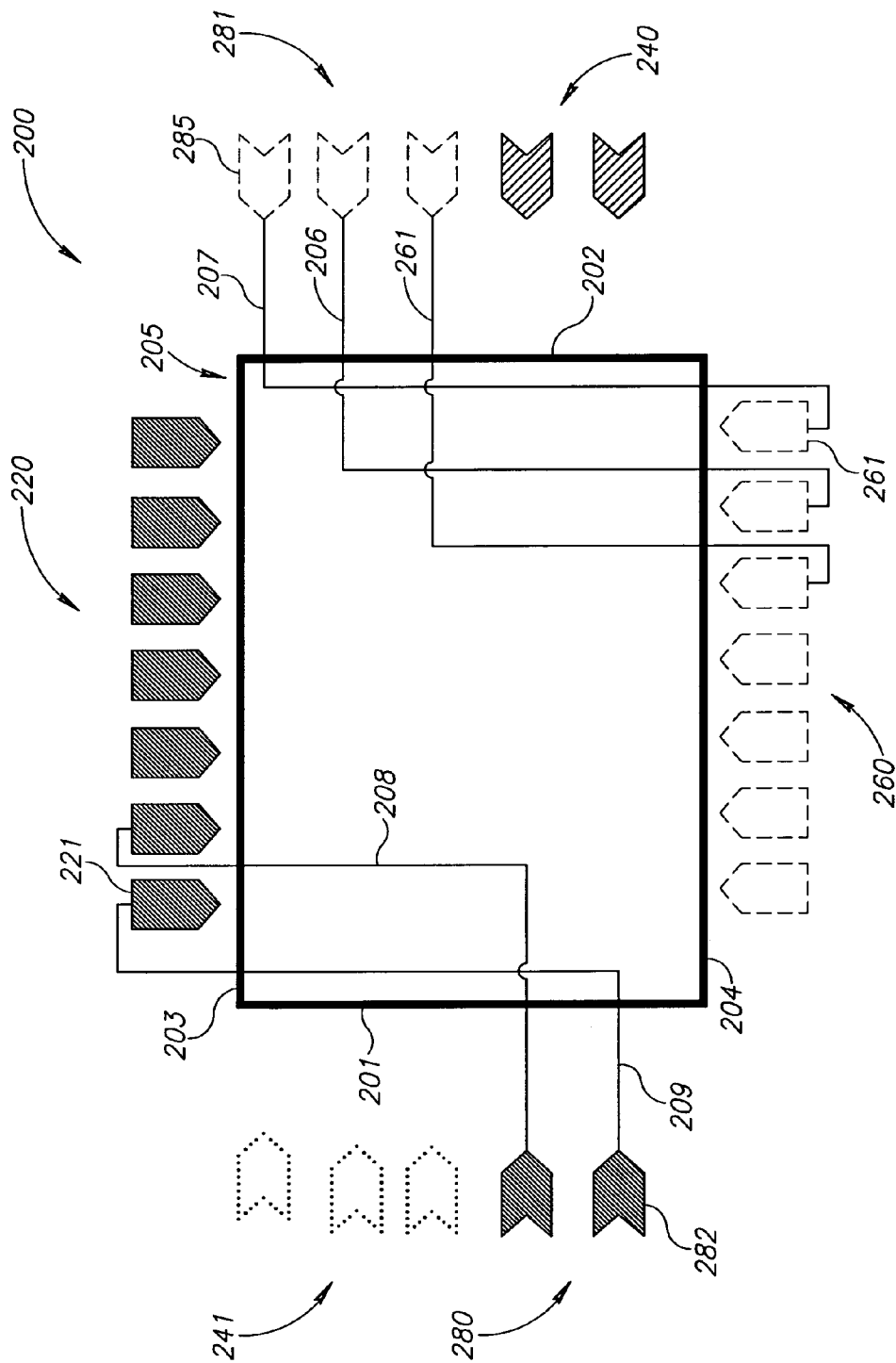

Reference is made to FIGS. 3A, 3B, and 3C which schematically show the interconnection of the pre-drivers and front-end drivers in the exemplary image sensor 200 of FIG. 2, in accordance with an embodiment of the invention. In accordance with an embodiment of the invention, the connection of the pre-drivers to the front-end drivers is done through equal length interconnects, and their location with respect to photo-surface 205 results in the gating signal reaching each pixel in the pixel array at substantially the same time. Skew time between the pixels is substantially reduced.

In FIG. 3A interconnects are shown connecting pre-drivers 210, located along edge 201, to front-end drivers 290, located internally in photo-surface 205 substantially along the diagonals of the array. In accordance with an embodiment of the invention, the physical lengths of all the interconnects are substantially the same. For example, an interconnect 255 extending from a pre-driver 211 associated with pre-drivers 210, to a front-end driver 291 associated with front-end drivers 290, and an interconnect 256 extending from a pre-driver 212 associated with pre-drivers 215, to a front-end driver 292 associated with front-end drivers 290, are of substantially the same length. Of equal length to interconnects 255 and 256 are interconnects 265, 266, 267, 268, and 269, which represent all other interconnects connecting all other pre-drivers 215 and 210 to all other front-end drivers 290.

In FIG. 3B interconnects are shown connecting pre-drivers 241, located along edge 201, to front-end drivers 250 oppositely located along edge 202, and pre-drivers 240, located along edge 202, to front-end drivers 270, oppositely located along edge 201. In accordance with an embodiment of the invention, the physical lengths of the interconnects are substantially the same. For example, an interconnect 257 extending from a pre-driver 243 associated with pre-drivers 241, to a front-end driver 251 associated with front-end drivers 250, and an interconnect 258 extending from a pre-driver 242 associated with pre-drivers 240, to a front-end driver 271 associated with front-end drivers 270, are of substantially the same length. Of equal length to interconnects 257 and 258 are interconnects 262, 263, and 264, which represent all other interconnects connecting all other pre-drivers 241 and 242 to all other front-end drivers 250 and 270, respectively.

In FIG. 3C interconnects are shown connecting pre-drivers 280, located along edge 201, to front-end drivers 220, adjacently located along edge 203, and pre-drivers 281, located along edge 202, to front-end drivers 260, adjacently located along edge 204. In accordance with an embodiment of the invention, the physical lengths of the interconnects are substantially the same. For example, an interconnect 209 extending from a pre-driver 282 associated with pre-drivers 280, to a front-end driver 221 associated with front-end drivers 220, and an interconnect 207 extending from a pre-driver 285 associated with pre-drivers 280, to a front-end driver 261 associated with front-end drivers 260, are of substantially the same length. Of equal length to interconnects 207 and 209 are interconnects 208, 206, and 261, which represent all other interconnects connecting all other pre-drivers 280 and 281 to all other front-end drivers 220 and 260, respectively.

Figure 4:
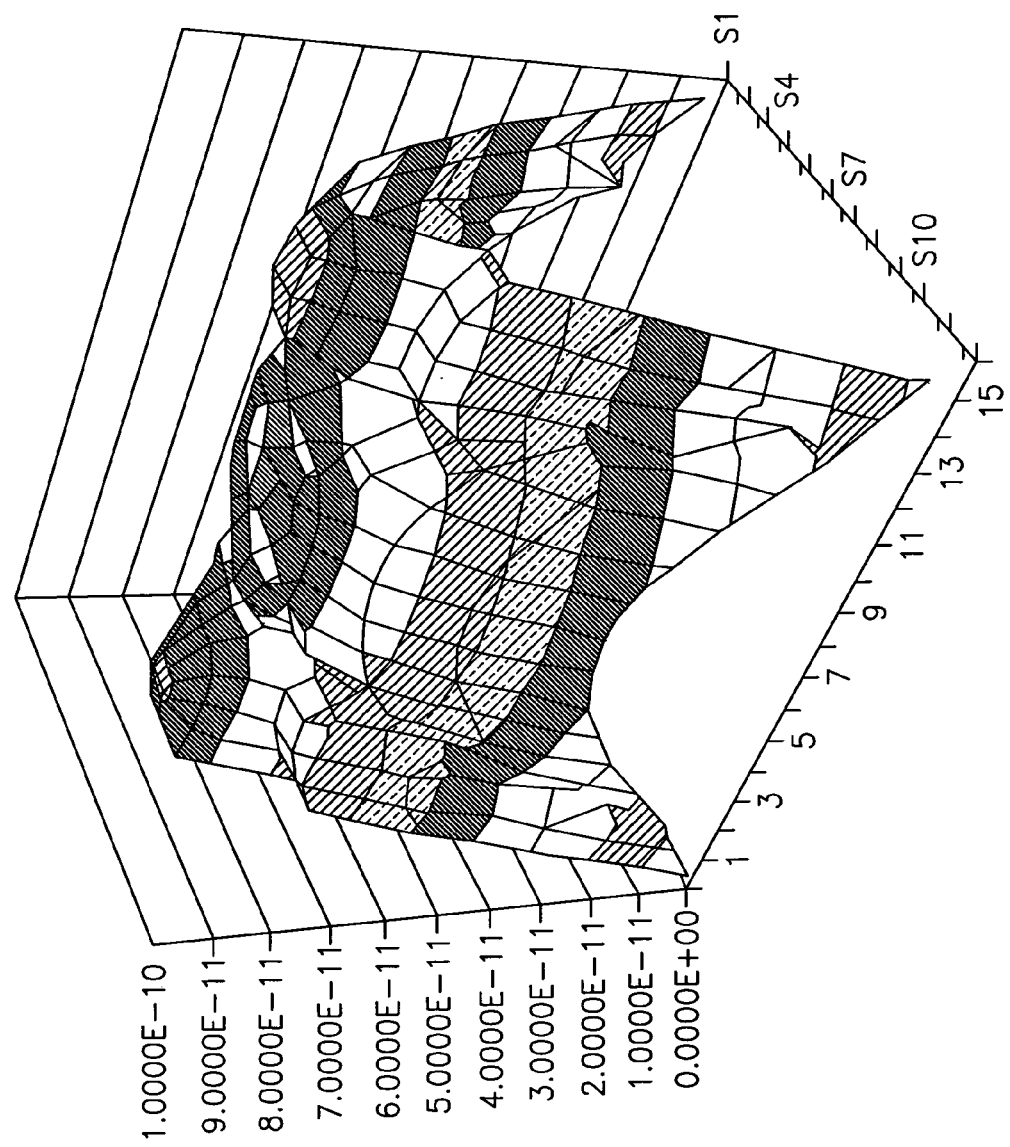

The inventors used a test bench model to simulate the pixel array and the gating signal, in a CMOS image sensor. The CMOS image sensor comprised a QVGA (320×240 pixels) pixel array. Multiple simulations were done with interconnects widths varying between 1 μm-2.5 μm, using M2 metal layer above M1, and TT, SS, FF, SF, and FS process corners. Reference is made to FIG. 4 which schematically illustrates a 3D graphical representation of the distribution of the skew throughout the pixel array for a simulated gating signal interconnect width of 2 μm and typical process corners TT, in accordance with an embodiment of the invention.

It may be appreciated by a person skilled in the art that the configuration for the array of elements shown in FIG. 1 at 105 may have many different applications not limited to image acquisition. In accordance with some embodiments of the invention, the disclosed configuration may be used in any application requiring substantially simultaneously application of a signal to an array of elements, or optionally an array of points. Additionally or alternatively, in accordance with some embodiments of the invention, the array of elements or points may be comprised on a surface. Examples of different applications, according to some embodiments of the invention, may be in display devices, and signaling/control devices adapted to substantially simultaneously send a signal to, or optionally activate, an array of elements and/or devices.

In the description and claims of embodiments of the present invention, each of the words, "comprise" "include" and "have", and forms thereof, are not necessarily limited to members in a list with which the words may be associated.

The invention has been described using various detailed descriptions of embodiments thereof that are provided by way of example and are not intended to limit the scope of the invention. The described embodiments may comprise different features, not all of which are required in all embodiments of the invention. Some embodiments of the invention utilize only some of the features or possible combinations of the features. Variations of embodiments of the invention that are described and embodiments of the invention comprising different combinations of features noted in the described embodiments will occur to persons with skill in the art.

The invention claimed is:

1. A method of providing a signal to a planar array, the method comprising:
    electrically connecting a plurality of pre-drivers along edges of a planar array to at least one conducting element;
    electrically connecting the plurality of pre-drivers to a plurality of front-end drivers, one pre-driver per front-end driver, wherein the pre-drivers are serially connected to respective front-end drivers of the plurality of front-end drivers via substantially equal length interconnects, the planar array comprises a matrix of pixels, the plurality of front-end drivers comprise front-end drivers located along a perimeter of the planar array but not located with any of the pixels in the matrix of pixels, and front-end drivers located with pixels in the planar array along diagonals of the matrix, and the matrix of pixels includes pixels which are not located with any of the plurality of front-end drivers; and
    providing the signal substantially simultaneously from the plurality of pre-drivers to the plurality of front-end drivers via the substantially equal length interconnects, thereby providing a reduced skew time between the pixels.

2. A method according to claim 1 wherein the front-end drivers located with the pixels in the planar array along the diagonals of the matrix are along both diagonals substantially of a same rectangle.

3. A method according to claim 2 wherein the rectangle is a substantially circumscribed or substantially inscribed rectangle.

4. A method according to claim 2 wherein the at least one conducting element comprises a planar xy-grid of equally spaced linear conductors parallel to the planar array of pixels.

5. A method according to claim 4 wherein the xy-grid has a rectangular perimeter having first and second sides parallel to an x-axis of the grid and third and fourth sides parallel to a y-axis of the grid.

6. A method according to claim 1, wherein the at least one conducting element is substantially planar and the planar array comprises a rectangular array of rows and columns of pixels.

7. A method according to claim 6 wherein the at least one conducting element has a rectangular perimeter having first and second sides parallel to an x-axis and third and fourth sides parallel to an orthogonal y-axis.

8. A method according to claim 7 wherein the sides of the perimeter are parallel to a rectangle that circumscribes the planar array of pixels.

9. A method according to claim 8 wherein providing the signal to front-end drivers along the perimeter comprises providing the signal to the at least one conducting element at contact regions along each of the sides of the rectangular perimeter of the conducting element.

10. A method according to claim 9 wherein the contact regions are substantially equally spaced around the perimeter.

11. A method according to claim 9 wherein providing the signal to a contact region comprises connecting an output of a first signal driver to the contact region and controlling the first signal driver to provide the signal at the output.

12. A method according to claim 11 wherein controlling the first signal driver comprises connecting each of first signal drivers to a different second signal driver with a substantially same length signal path and controlling the second signal drivers to simultaneously transmit the signal to their respective first signal drivers.

13. A method according to claim 12 wherein the second signal drivers are located along the third and fourth sides of the rectangular perimeter of the at least one conducting element.

14. A method according to claim 13, further comprising electrically connecting each first driver along the third and fourth sides of the perimeter of the at least one conducting element to a second driver respectively along the fourth and third side of the perimeter.

15. A method according to claim 14 wherein connecting a first driver along the third or fourth side to a second driver along the fourth or third side respectively comprises connecting them with a rectilinear conductor substantially parallel to the x-axis.

16. A method according to claim 13, further comprising electrically connecting each first driver along the first and second sides of the perimeter of the at least one conducting element to a second driver along the third and fourth side respectively.

17. A method according to claim 16 wherein electrically connecting each first driver along the first and second sides of the perimeter to a second driver comprises connecting each first driver to a different second driver.

18. A method according to claim 17 wherein electrically connecting each first driver along the first and second side to a different second driver along the third and fourth side respectively comprises connecting them with rectilinear conductors substantially parallel to the planar array of pixels.

19. A method according to claim 18 wherein electrically connecting first drivers along the first and second sides to second drivers along the third and fourth side respectively comprises connecting each first driver to a second driver with a rectilinear conductor parallel to the y-axis that extends from a region near the first driver that meets a second rectilinear conductor parallel to the x-axis that extends from a region near the second driver.

20. A method according to claim 8 wherein providing the signal to front-end drivers located with the pixels in the planar array along diagonals of the circumscribed rectangle comprises providing the signal to the at least one conducting element at contact regions along the diagonals of the rectangular perimeter of the at least one conducting element, wherein the contact regions are substantially equally spaced along the diagonals.

21. A method according to claim 6 wherein the at least one conducting element comprises a continuous planar conducting sheet parallel to the planar array of pixels.

22. A method according to claim 1 wherein the at least one conducting element comprises a planar xy-grid of equally spaced linear conductors parallel to the planar array of pixels.

23. A method according to claim 1 wherein the signal is provided substantially simultaneously to the plurality of pre-drivers along the edges of the planar array using a binary clock tree.

24. A method according to claim 23 wherein the pixels are in a photosurface, and the signal is a gating signal which is able to trigger operation of all the pixels at substantially a same time.

25. A method according to claim 1, wherein the pixels which are not located with any of the plurality of front-end drivers comprise pixels which are adjacent to the pixels in the planar array along the diagonals of the matrix.

26. An image sensor apparatus, comprising:
a planar array comprising a matrix of pixels;
a plurality of pre-drivers along edges of the planar array and electrically connected to at least one conducting element; and
a plurality of front-end drivers, the pre-drivers are serially connected to respective front-end drivers of the plurality of front-end drivers via substantially equal length interconnects, wherein the plurality of front-end drivers comprise front-end drivers located along a perimeter of the planar array but not located with any of the pixels in the matrix of pixels, and front-end drivers located with pixels in the planar array along diagonals of the matrix, and the matrix of pixels includes pixels which are not located with any of the plurality of front-end drivers.

27. The image sensor apparatus of claim 26, wherein the at least one conducting element is substantially planar and the planar array comprises a rectangular array of rows and columns of pixels.

28. The image sensor apparatus of claim 26, wherein a signal is provided substantially simultaneously to the plurality of pre-drivers along the edges of the planar array using a binary clock tree.

29. A image sensor apparatus of claim 26, wherein the pixels which are not located with any of the plurality of front-end drivers comprise pixels which are adjacent to the pixels in the planar array along the diagonals of the matrix.

* * * * *

UNITED STATES PATENT AND TRADEMARK OFFICE
CERTIFICATE OF CORRECTION

PATENT NO. : 8,634,006 B2  
APPLICATION NO. : 12/865622  
DATED : January 21, 2014  
INVENTOR(S) : Yahav et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 574 days.

Signed and Sealed this
Twenty-second Day of September, 2015

Michelle K. Lee
*Director of the United States Patent and Trademark Office*